United States Patent
Rocha-Alvarez et al.

(10) Patent No.: US 7,554,103 B2
(45) Date of Patent: Jun. 30, 2009

(54) INCREASED TOOL UTILIZATION/REDUCTION IN MWBC FOR UV CURING CHAMBER

(75) Inventors: Juan Carlos Rocha-Alvarez, Sunnyvale, CA (US); Thomas Nowak, Cupertino, CA (US); Sanjeev Baluja, San Francisco, CA (US); Andrzej Kaszuba, San Jose, CA (US); Ndanka O. Mukuti, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 267 days.

(21) Appl. No.: 11/562,043

(22) Filed: Nov. 21, 2006

(65) Prior Publication Data
US 2007/0298362 A1 Dec. 27, 2007

Related U.S. Application Data

(60) Provisional application No. 60/816,706, filed on Jun. 26, 2006.

(51) Int. Cl.
*G21G 1/00* (2006.01)

(52) U.S. Cl. ............................ 250/492.1; 250/455.11; 250/504 R; 118/50; 118/50.1; 118/620; 118/723 R; 427/532; 427/553; 427/557; 427/558

(58) Field of Classification Search ............. 250/492.1, 250/455.11, 504 R; 118/50, 50.1, 620, 641, 118/715, 723 R, 723 VE, 724, 725; 427/532, 427/553, 557, 558
See application file for complete search history.

(56) References Cited

U.S. PATENT DOCUMENTS

| | | | | |
|---|---|---|---|---|
| 5,405,444 A | * | 4/1995 | Moslehi | 118/725 |
| 6,189,482 B1 | * | 2/2001 | Zhao et al. | 118/723 R |
| 6,215,106 B1 | * | 4/2001 | Boas et al. | 219/390 |
| 6,280,790 B1 | * | 8/2001 | White et al. | 427/8 |
| 6,364,954 B2 | * | 4/2002 | Umotoy et al. | 118/715 |
| 6,423,947 B2 | * | 7/2002 | Womack et al. | 219/390 |
| 6,566,278 B1 | | 5/2003 | Harvey et al. | |
| 6,614,181 B1 | | 9/2003 | Harvey et al. | |
| 6,803,546 B1 | * | 10/2004 | Boas et al. | 219/390 |
| 2005/0150452 A1 | * | 7/2005 | Sen et al. | 118/715 |
| 2006/0043318 A1 | * | 3/2006 | Kodera | 250/504 R |
| 2006/0251827 A1 | * | 11/2006 | Nowak et al. | 427/558 |
| 2007/0224833 A1 | * | 9/2007 | Morisada et al. | 438/758 |
| 2007/0295012 A1 | * | 12/2007 | Ho et al. | 62/56 |
| 2007/0298167 A1 | * | 12/2007 | Ho et al. | 427/230 |

* cited by examiner

Primary Examiner—David A. Vanore
Assistant Examiner—Michael Maskell
(74) Attorney, Agent, or Firm—Townsend and Townsend and Crew

(57) ABSTRACT

A pump liner is used to direct a laminar flow of purge gas across a workpiece to remove contaminants or species outgassed or otherwise produced by the workpiece during processing. The pump liner can take the form of a ring having a plurality of injection ports, such as slits of a variety of shapes and/or sizes, opposite a plurality of receiving ports in order to provide the laminar flow. The flow of purge gas is sufficient to carry a contaminant or outgassed species from the processing chamber in order to prevent the collection of the contaminants on components of the chamber. The pump liner can be heated, via conduction and irradiation from a radiation source, for example, in order to prevent the condensation of species on the liner. The pump liner also can be anodized or otherwise processed in order to increase the emissivity of the liner.

25 Claims, 5 Drawing Sheets

- Top View -

- Top View -

- Bottom View -

*- Top View -*

*- Bottom View -*

INCREASED TOOL UTILIZATION/REDUCTION IN MWBC FOR UV CURING CHAMBER

CLAIM OF PRIORITY

This application claims priority to U.S. Provisional Application No. 60/816,706, entitled "Increased Tool Utilization/Reduction in MWBC for UV Curing Chamber," filed Jun. 26, 2006, which is hereby incorporated herein by reference.

BACKGROUND OF THE INVENTION

Materials such as silicon oxide ($SiO_x$), silicon carbide (SiC), and carbon doped silicon oxide ($SiOC_x$) films find widespread use in the fabrication of semiconductor devices. One approach for forming such silicon-containing films on a semiconductor substrate is through the process of chemical vapor deposition (CVD) within a chamber. For example, a chemical reaction between a silicon supplying source and an oxygen supplying source may result in deposition of solid phase silicon oxide on top of a semiconductor substrate positioned within a CVD chamber. As another example, silicon carbide and carbon-doped silicon oxide films may be formed from a CVD reaction that includes an organosilane source including at least one Si—C bond.

Water is often a by-product of such a CVD reaction of oganosilicon compounds. As such, water can be physically absorbed into the films as moisture or incorporated into the deposited film as Si—OH chemical bond. Either of these forms of water incorporation is generally undesirable. Accordingly, undesirable chemical bonds and compounds such as water are preferably removed from a deposited carbon-containing film. Also, in some particular CVD processes, thermally unstable organic fragments of sacrificial materials (resulting from porogens used during CVD to increase porosity) need to be removed.

One common method used to address such issues is a conventional thermal anneal. The energy from such an anneal replaces unstable, undesirable chemical bonds with more stable bonds characteristic of an ordered film thereby increasing the density of the film. Conventional thermal anneal steps are generally of relatively long duration (e.g., often between 30 min to 2 hrs.) and thus consume significant processing time and slow down the overall fabrication process.

Another technique to address these issues utilizes radiation such as infrared (IR), ultraviolet (UV), or visible radiation to aid in the post treatment of CVD-produced films such as silicon oxide, silicon carbide, and carbon-doped silicon oxide films. For example, U.S. Pat. Nos. 6,566,278 and 6,614,181, both to Applied Materials, Inc. and incorporated by reference herein in their entirety, describe the use of UV light for post treatment of CVD carbon-doped silicon oxide films. The use of UV radiation for curing and densifying CVD films can reduce the overall thermal budget of an individual wafer and speed up the fabrication process. A number of various UV curing systems have been developed which can be used to effectively cure films deposited on substrates. One example of such is described in U.S. application Ser. No. 11/124,908, filed May 9, 2005, entitled "High Efficiency UV Curing System," which is assigned to Applied Materials and incorporated herein by reference for all purposes.

During these curing techniques, as well as other such procedures, it is common for water molecules and various other species to be outgassed or otherwise released from the film or material being cured or processed. These species tend to collect on various exposed surfaces of the chamber, such as windows in the chamber, that can reduce the efficiency of the process. Further, the build-up of these species on the surfaces requires periodic cleaning of the chamber surfaces, such as after every 200 wafers processed, which results in significant tool downtime and a corresponding reduction in manufacturing throughput. The contamination levels after processing typically are used as a benchmark for cleaning intervals. It generally is desirable to have a high MWBC value (mean wafer between clean), or mean number of wafers processed between cleanings, in order to reduce costs and system downtime. In some swept source systems, for example, a MWBC of 800-1200 wafers is considered to be an undesirably low value of MWBC, caused by factors such as the condensation of outgassed materials on relatively cold surfaces of the processing chamber.

For reasons including these and other deficiencies, and despite the development of various curing chambers and techniques, further improvements in this important technology area are continuously being sought.

BRIEF SUMMARY OF THE INVENTION

Systems and methods in accordance with embodiments of the present invention can prevent the collection of contaminants, outgassed species, and other materials on components of a processing chamber or other such housing.

In one embodiment, a system for curing a workpiece includes a chamber housing, which can include curing chamber and a chamber for housing a radiation source, for example. A substrate support in the chamber housing is used to support a workpiece, such as a semiconductor wafer, being processed. A radiation source, such as an ultraviolet (UV) lamp, can direct radiation onto a workpiece supported on the substrate support in order to cure at least a layer or region of the workpiece. A pump liner is positioned in the chamber housing about the periphery of the workpiece, such as a ring-shaped liner positioned about the circular outer edge of a semiconductor wafer. The pump liner has gas inlet plenums and gas outlet plenums for receiving and exhausting a flow of purge gas. The pump liner also has a plurality of injection slits operable to direct a substantially laminar flow of purge gas across a surface of the workpiece being cured. A plurality of receiving slits are positioned opposite the plurality of injection slits and operable to receive the flow of gas directed across the wafer. The receiving slits are sized and shaped to receive the flow of gas and any species or contaminants outgassed or otherwise released from the workpiece during processing.

In one embodiment, a pump liner for directing a flow of purge gas across a workpiece in a processing chamber includes a ring-shaped element formed of a material such as aluminum. The element has a central opening shaped to fit around a periphery of a workpiece, such as the outer edge of a semiconductor wafer. The ring-shaped element includes an inlet plenum operable to receive a flow of purge gas into a first channel in the ring-shaped element and an exhaust plenum operable to direct the flow of purge gas out of a second channel in the ring-shaped element. A plurality of injection ports positioned near the central opening of the ring-shaped element direct a laminar flow of the purge gas, received by the inlet plenum, from the first channel and across a surface of the workpiece. A plurality of receiving ports positioned near the central opening of the ring-shaped element, substantially opposite the plurality of injection ports, receive the flow of purge gas directed across the surface of the workpiece, as well as any species outgassed or otherwise released by the workpiece during processing. The injection and receiving ports can include slits or other openings that are sized and shaped to direct and receive the laminar flow of gas, and receive any species or contaminants outgassed or otherwise released from the workpiece during processing.

The flow of purge gas is selected to have a sufficient mass and momentum so that the purge gas can carry the outgassed species. The pump liner directs the flow and outgassed species through the second channel and out of the ring-shaped element through the exhaust plenum. The pump liner can be heated through conduction and by irradiation from a curing source. The pump liner also can be anodized to increase the emissivity of the liner. The contact area between the pump liner and the chamber body can be minimized in order to minimize the amount of heat flow, and thus heat loss, from the pump liner to the chamber body.

In one embodiment, a method for curing a workpiece includes positioning a workpiece to be cured on a workpiece support in a processing chamber. Radiation capable of curing at least a layer or region of the workpiece is directed toward a surface of the workpiece. A laminar flow of purge gas is provided across the irradiated surface of the workpiece. The laminar flow emanates from a pump liner having a plurality of injection slits and a plurality of receiving slits for directing and receiving the flow. The size, shape, position, and number of the slits are selected to generate the substantially laminar flow, as well as to transport any species outgassed from the irradiated surface of the workpiece. The flow of purge gas and the outgassed species are exhausted from the pump liner and the chamber after the flow passes across the irradiated surface and is received by the receiving slits of the pump liner. The contact area of the pump liner with the chamber body can be minimized in order to minimize heat flow and thus heat loss.

These and other embodiments of the present invention, as well as its advantages and features, are described in more detail in conjunction with the text below and attached figures.

BRIEF DESCRIPTION OF THE DRAWINGS

Various embodiments in accordance with the present invention will be described with reference to the drawings, in which.

DETAILED DESCRIPTION OF THE INVENTION

Systems and methods in accordance with various embodiments of the present invention overcome the aforementioned and other deficiencies in existing anneal, cure, and other processing systems by providing a removal mechanism for outgassed species before those species can collect on the surfaces of the processing chamber. In some embodiments, a pump liner or other component for generating a flow of purge gas can be used in a chamber such as a vacuum chamber to direct a substantially laminar flow of gas across the surface of a wafer or other workpiece during a process such as a UV cure process. Such a flow can carry away any species outgassed by the workpiece. The liner can be passively heated by the convection in the chamber as well as the curing light source, such that the species do not collect on the liner and can be efficiently exhausted from the chamber. In one embodiment, the pump liner is anodized to increase the absorption efficiency of the liner. A window between the workpiece and the curing light source also can have a sufficient diameter to allow light from the source to fall directly onto the liner, in order to provide additional energy to heat the liner. The liner can be formed to have minimal contact with the bulk of the processing chamber body, which typically is kept at around 75° C. in one embodiment, in order to minimize heat flow (and thus loss) from the liner to the chamber body. The liner also can have slits of varying shape, width, and/or height in order to control the flow of gas across the workpiece surface, so that the flow direction is substantially laminar and so that the velocity of the gas across the wafer is substantially uniform from one side of the wafer to the other.

Figure 1A:
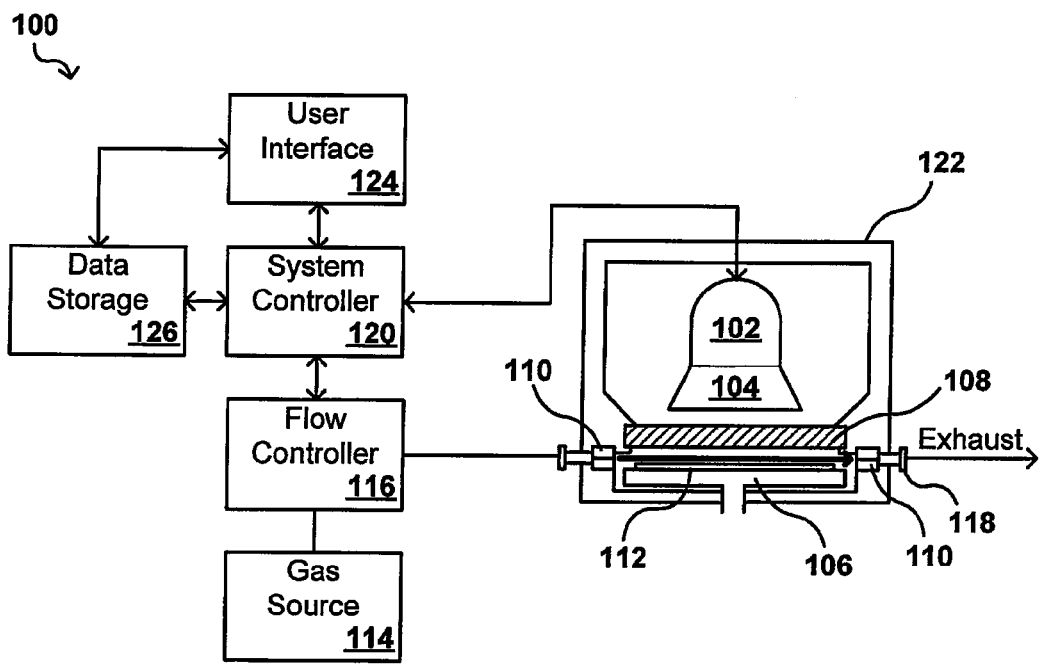
FIGS. 1(a) and (b) illustrate an exemplary processing system that can be used in accordance with one embodiment of the present invention.

FIGS. 1(a) and (b) shows an exemplary curing system 100 that can be used in accordance with one embodiment, although aspects of the present invention can be used advantageously in a number of other systems and applications as would be apparent to one of ordinary skill in the art in light of the description and suggestions contained herein. This system 100 includes a light source 102 for the curing process, such as a UV or IR lamp as known in the art. A reflector 104 is positioned between the lamp 102 and a substrate support 104, in order to focus light from the lamp toward the substrate support. The reflector can also be used to shape the footprint of the light on the substrate support. The substrate support 104 can be any appropriate device operable to support workpieces such as semiconductor wafers in place during a cure process. In one example, the workpiece support is a cylindrical chuck operable to support semiconductor wafers. The chuck can be translatable in order to position a wafer relative to the lamp, and can have a vacuum port or other apparatus for maintaining the wafer in position on the chuck during processing.

The lamp 102 is positioned inside a processing chamber 122, which can include a window 108 to separate a lamp housing portion of the chamber from the substrate housing portion of the chamber. The window 108 can be any appropriate window, such as a dielectric window (e.g., quartz) that is transparent to the curing radiation from the lamp 102. The window may be of any appropriate dimension, so long as the window is strong enough to prevent fracture during operation and is thin enough so that substantially all of the radiation from the lamp passes through the window. The window 108, as well as any seal used between the window and the chamber walls, for example, separates the lamp 102 and reflector 104 from the substrate support 106, such that any materials outgassed from a workpiece during a cure procedure do not collect on or contaminate the lamp, reflector, or other optical components of the lamp housing portion of the processing chamber. The window also can have a shape that matches the area to be cured. For example, if the workpiece to be processed is a 300 mm semiconductor wafer, the window can be shaped to have a cylindrical cross-section (parallel to the surface of the wafer to be cured) of about 300 mm in cross section in order to expose the entire surface of the wafer to the radiation. The reflector also can ensure that the footprint of the light substantially matches this shape, so that substantially all of the light is focused for processing and does not contact the chamber walls or other components, which could undesirably heat these components.

Figure 1B:
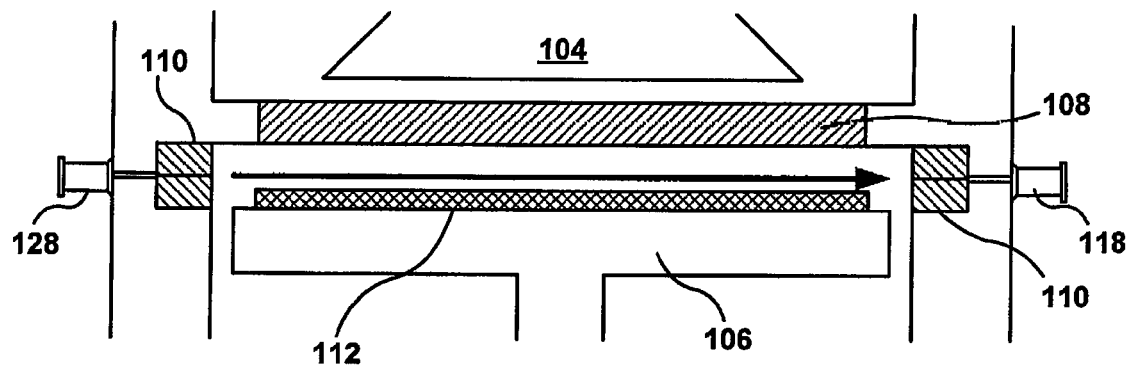

Even though the window 108 can substantially prevent any outgassed species or other contaminants or particles from entering the lamp housing portion and contaminating the lamp, the window itself is still subject to deposition, condensation, or collection of the species on the exposed surface of the window (near the workpiece). Further, other surfaces in the substrate housing portion still can be exposed to these species. In the embodiment of FIGS. 1(a) and 1(b), a pump liner 110 is provided in the substrate housing portion of the chamber for directing a laminar flow of gas across the exposed surface of a workpiece 112 on the substrate support 106. FIG. 1(b) shows components near the pump liner (shown in cross-section) in more detail that FIG. 1(a), and numbers are carried over between figures where appropriate. The liner be used to direct a flow of gas that is received from a gas source 114 and regulated by a gas flow controller 116, as known in the art. The liner 110 also can collect the flow of gas after passing across the workpiece 112 and direct the gas out of the chamber through an exhaust port 118, in order to remove any outgassed species and contaminants from the processing chamber. The flow creates a protective gas purge between the workpiece and the chamber window to protect against by-product buildup on the window. The laminar flow acts as a curtain to shield the window and also to sweep any outgassed residue away before the residue can collect on the window and surrounding chamber. The laminar flow of the protective purge gas can help to maximize uniformity of the flow and to avoid any recirculation zones. In one embodiment, the flow is from the back of the chamber to the front of the chamber in order to be parallel with the slit valve and reduce the effects of the valve on the flow pattern.

The gas source 114 can be any appropriate source operable to provide a flow of an appropriate gas. A number of various gasses and gas combinations are known for use as purge gases, and can be used in such an implementation. In one embodiment, the purge gas used is primarily (or pure) argon due to the large molecular mass, which increases the momentum and energy of the gas "curtain." In another embodiment, a combination of argon and helium was found to provide sufficient heat transfer while having sufficient mass and momentum to carry away the outgassed residue. Other suitable gases can include, for example, He, Ar, $N_2$, $O_2$, $O_3$, $H_2$, $NH_3$, $N_2O$, $H_2O$ (vapor), and NO.

The pump liner can be any device, element, or component operable to direct a laminar flow of gas across a workpiece, such as a rectangular element directing a flow across the chamber, a pair of parallel liners, or a series of gas ports directing a series of input gas flows that combine to create a single gas flow across the wafer. Many of these designs can be problematic, however, as the gas flow patterns can be irregular, and can create turbulence or recirculation zones, such that the species are not evenly carried away, and can even be allowed to accumulate on the window or other components near these turbulent zones. For these reasons, as well as heating and other reasons discussed herein, various embodiments utilize a ring-shaped pump liner as will be discussed with respect to FIGS. 2-3. The pump liner regions shown in FIGS 1(a) and 1(b) correspond to portions of a single ring liner shown in cross-section. These liner portions also can be referred to as chamber pumping rings, providing a laminar flow of purge gas across the surface of a workpiece.

The flow controller 116 and/or light source 102 can be monitored and/or controlled by a system controller 120 using control and other signals as known in the art. En one example, an intensity monitor (not shown) in the chamber can feed a monitor signal to the system controller 120, which can then display or relay this information to a user or operator via a user interface device. If the intensity is not sufficient, the system controller can generate a control signal instructing the lamp apparatus to increase the intensity used to expose the workpiece. If the system controller notices that the intensity cannot be maintained above a minimum intensity threshold, such as may be stored in a data storage device 126 for the system, then the system controller can generate an alert signal indicating that the lamp apparatus is not functioning properly, and may require maintenance such as the replacement of the bulb. The system controller can send this alert signal to an appropriate device, such as an alarm that alerts an operator of the system. In this example, the signal is sent to a user interface device 124, such as a personal computer or wireless-enabled PDA, which allows a user or operator of the system to be notified that the lamp assembly requires attention. The user interface also can allow the user or operator to observe the various monitored parameters and components of the system, and can allow the user or operator to adjust or control various settings and parameters for operation of the system as known in the art.

As would be apparent to one of ordinary skill in the art, the system controller can monitor various aspects of the overall system, such as the flow rate, pressures, temperatures, gas component levels, etc., by receiving signals from the appropriate sensors, and can alert operators and/or control components to adjust parameters or perform maintenance as necessary. For example, the system controller can monitor the flow rate of gas through the pump liner, and can adjust the input flow in response thereto. Various other uses and applications of the system controller, user interface, and data storage would be apparent to one of ordinary skill in the art in light of the descriptions and suggestions contained herein.

As shown in FIG. 1(b), the diameter of the dielectric window 108 can be such that radiation can reach the entire periphery of the workpiece, as well as at least an interior peripheral surface (with respect to the chamber) of a ring-shaped pump liner 110. In some embodiments, the reflector 104 alters the flood pattern of the light source 102 from a substantially rectangular area to a substantially circular shape that corresponds to the substantially circular semiconductor substrate being exposed and/or the substantially circular inner surface of the liner 110. Allowing the light to impinge on a surface of the pump liner allows the liner to be passively heated, as will be discussed in detail later herein.

In some embodiments, the light source may comprise two or more individual light sources. In one such tool, first and second UV lamps generate a flood pattern for a single chamber. The UV lamps include a UV source (e.g., an elongated UV bulb) and a primary reflector, with a secondary reflector being positioned between the UV lamps and the chamber. The two UV lamps can be mounted at an angle to each other. In some embodiments the opposing angles are between 5-25 degrees relative to vertical. The inclusion of two lamps can result in a higher intensity of UV radiation being generated within the flood pattern, which in turn can result in faster curing times.

Figure 2A:
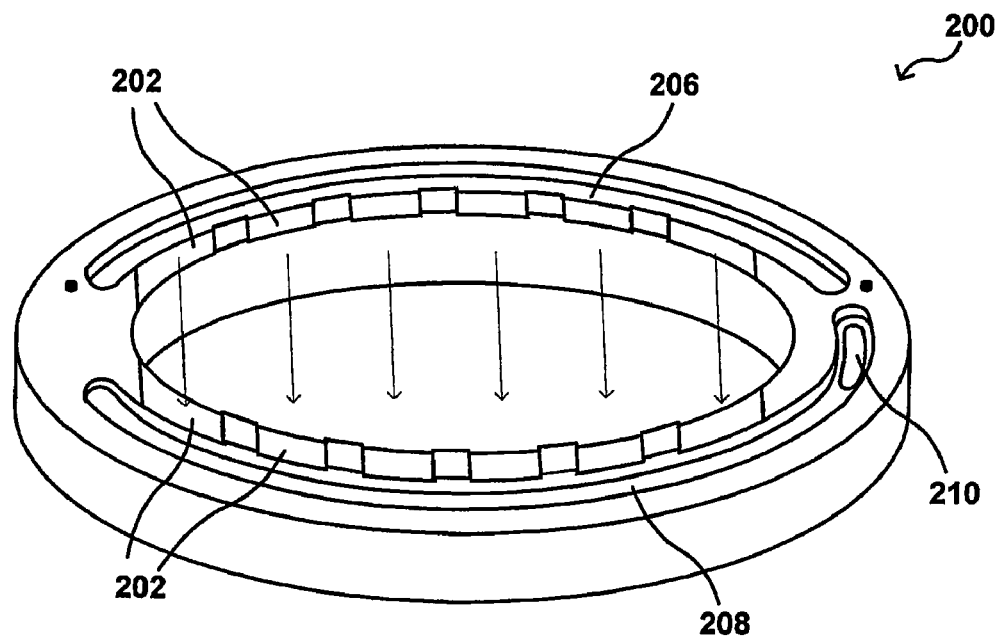
FIGS. 2(a) and (b) illustrate a first pump liner portion that can be used in accordance with one embodiment of the present invention.
Figure 2B:
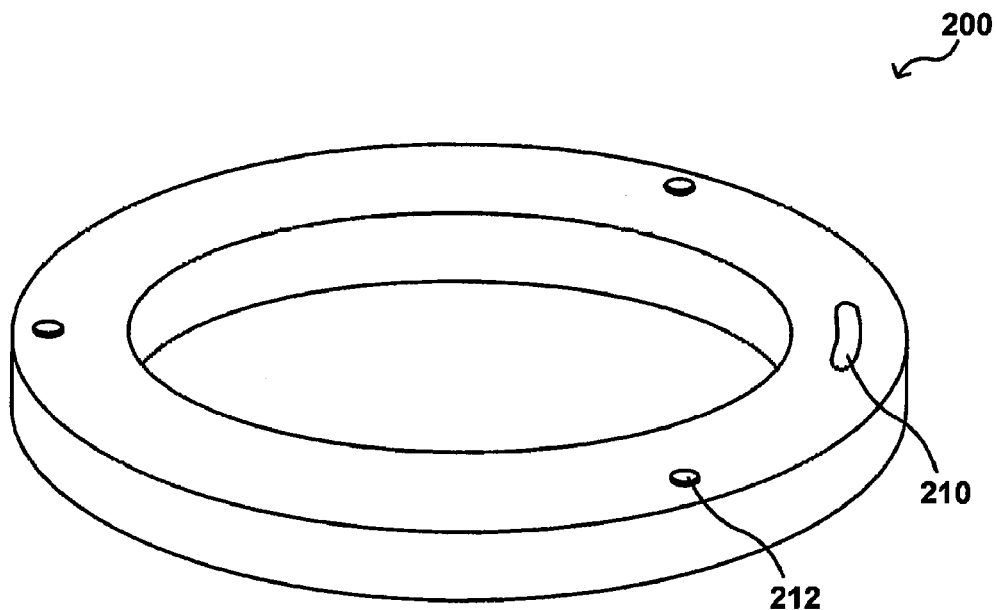
Figure 3A:
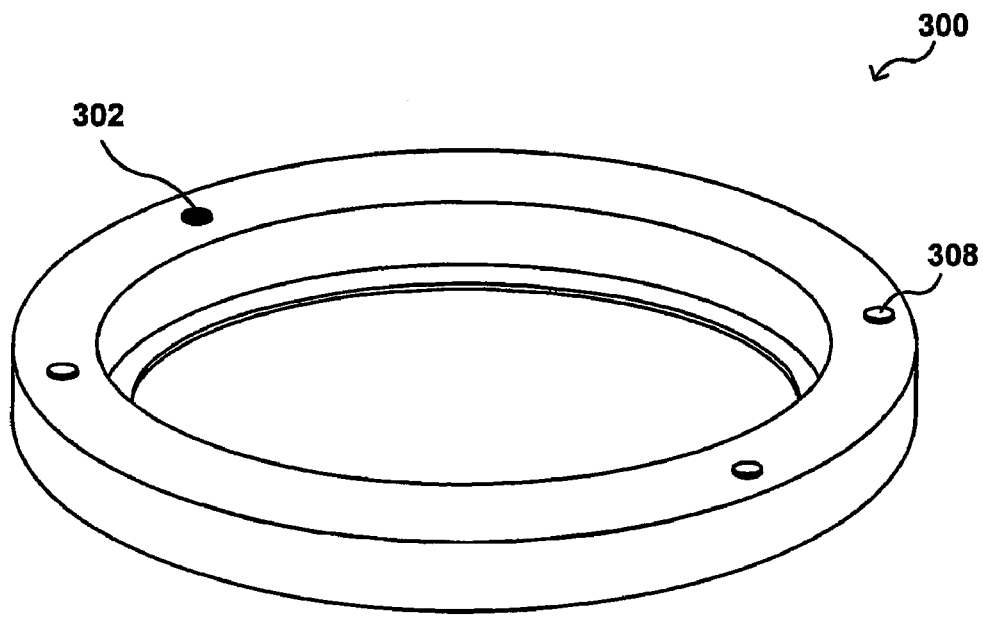
FIGS. 3(a) and (b) illustrate a second pump liner portion that can be used with the first pump liner portion of FIGS. 2(a) and (b) in accordance with one embodiment of the present invention.
Figure 3B:
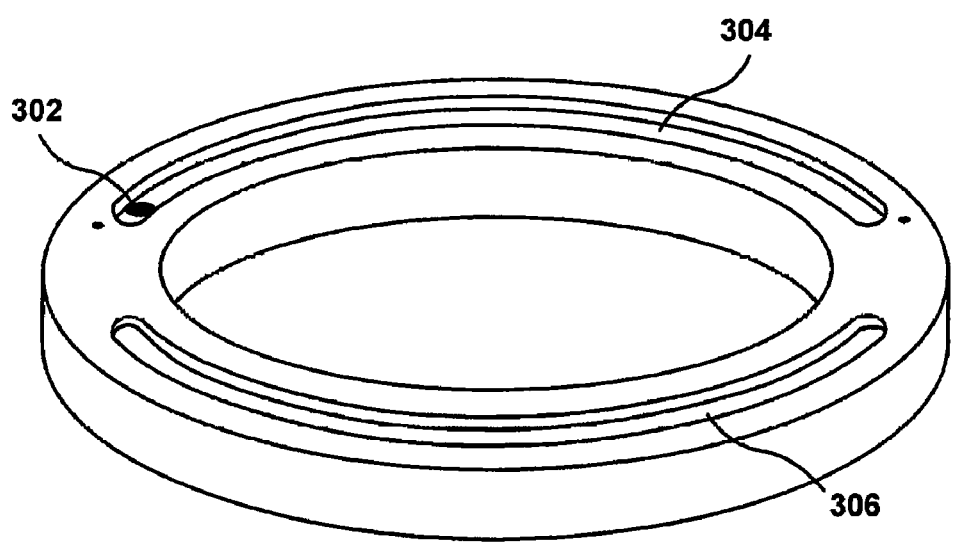

A pump liner can be a single piece, or can include upper and lower liner portions that are mated together to form a single structure. For example, FIGS. 2(a) and 2(b) show top and bottom perspective views, respectively, of a lower liner portion 200, and FIGS. 3(a) and 3(b) show top and bottom perspective views, respectively, of an upper liner portion 300, in accordance with one embodiment. When mated together, the portions form a single ring-shaped structure having a pair of opposing channels 206/304, 208/306 therein. One of these channels has an inlet plenum 302, with the other having an outlet plenum 210, such that gas can be flowed into one of the channels, can exit the liner and flow across the wafer into the other channel, then be exhausted via the outlet.

As shown in FIG. 2(a), an exemplary lower liner portion 200 includes a set of substantially parallel and opposing injection and receiving ports, or slits 202, which in this diagram are shown as grooves extending from one edge position of the lower liner portion to an opposing edge portion, which when the lower portion is mated with the upper portion form slits between the two portions. As shown, the upper liner 300 includes a gas input plenum 302 allowing gas to flow into the assembled liner and be directed into the first channel (formed by grooves 206 and 304) and out the slits 202 adjacent that first channel. The gas will flow across the surface of the wafer (along the direction of the arrows), just above the exposed surface of the wafer, and be received into slots 202 adjacent a second channel 208 (formed by grooves 208 and 306). The second channel includes an exhaust plenum 210 which allows the gas and any outgassed species and contaminants to be directed out of the pump liner, which can be connected through an exhaust port (such as port 118 in FIGS. 1(a) and (b)) and out of the chamber. Although this example includes an inlet plenum in one portion and the outlet plenum in the other portion, it should be understood that the plenums could be in the same portion or in the opposite liner portions, for example.

As will be discussed later herein, it also can be seen that the upper and lower portions include contact members 212, 308, such as cylindrical feet or pads, that provide minimal contact between the pump liner and the surrounding chamber body. The chamber pumping liners also can have a minimum contact flange to reduce parasitic pumping away from the laminar flow path.

Figure 4:
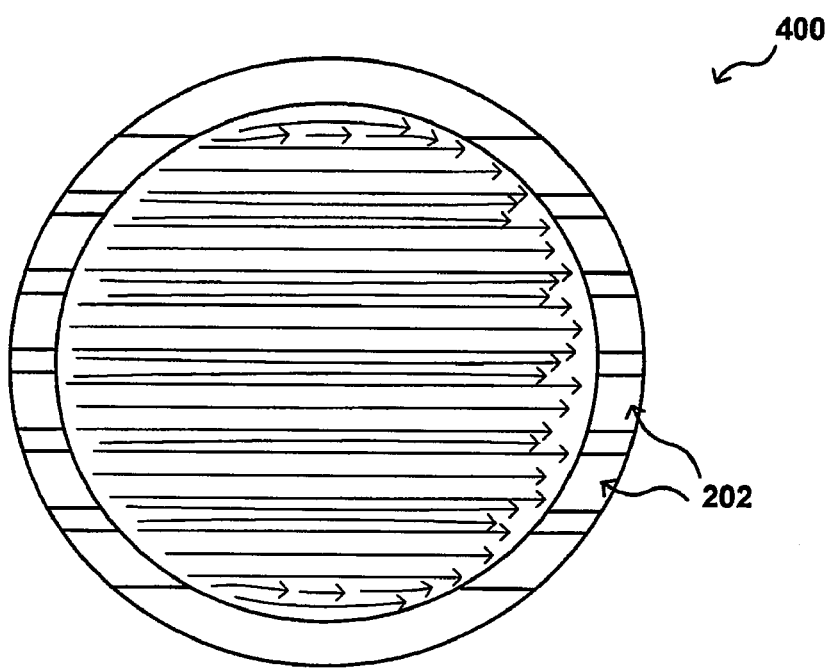
FIG. 4 illustrates a flow pattern for purge gas using a pump liner in accordance with one embodiment of the present invention.

The opposing slits 202 in the liner when assembled provide for a uniform, laminar gas purge between the wafer and the vacuum window. An example of such a flow is illustrated in the plot 400 of FIG. 4. As can be seen, the flow between the opposing slits is substantially linear and parallel. It is only areas at the edges and outside the opposing slits where a slight nonlinearity to the flow can be seen, but this non-linearity is not severe enough to negatively affect the flow. Maintaining proper slit spacing and flow rate can ensure that the flow is substantially laminar across the workpiece.

Another way to minimize the occurrence of turbulence is to ensure substantially even flow rates across the wafer. Because the gas does not need to travel as far need the edges of the workpiece as near the middle, evenly sized slits can tend to cause uneven flow rates across the wafer. As such, a pump liner in accordance with various embodiments can include slits having a number, width, height, and/or spacing selected to provide a substantially even flow across the workpiece. In one example, the slit sizes at the first channel (having the inlet) are relatively small, on the order of about 0.020", to increase the gas exit velocity and provide a uniform pressure distribution upstream of the inlet slits. The slit sizes near the second channel (having the outlet plenum) are larger (e.g., 3× to 5×) than the depth of the inlet slits in order to reduce pressure drop across the exhaust slits. The exhaust slits also can be deeper near the edge of the workpiece to increase gas flow at the sides of the workpiece (as opposed to the center).

In another example, a total of six slits were used across the pump liner, varying in width from 1.0 to 2.0 inches and in height from 0.045 to 0.200 inches. The spacing between slits varied from 0.40 to 1.00 inches. The flow rate of Ar/He gas in this example was approximately 16 slm/16 slm. Further, although the slits are described to be rectangular in cross-section, it should be understood that other shapes can be used as well to help facilitate even flow across workpieces for various systems and applications.

When designing the pump liner, it can be desirable to optimize various factors such as slit size and chamber pressure. For example, for a 16 slm Ar/16 slm He flow, slit sizes of 0.045 and 0.060 inches were found to have more recirculation of gas inside the wafer than slit sizes of 0.075 and 0.090 inches. Further, a chamber pressure of 3 Torr was found to have more recirculation than a chamber pressure of 6 Torr. Therefore, in this example it was found that larger slit sizes of 0.075 inches and 0.090 inches, along with a higher chamber pressure of 6 Torr, were desirable in order to minimize recirculation of gas and obtain a higher uniformity of flow.

One particular contaminant of concern is porogen outgassed from a wafer during a UV curing process, which can deposit on the vacuum window. Porogen is described, for example, in U.S. Pat. Nos. 6,171,945 and 6,451,367, both of which are incorporated herein by reference. Any such buildup on the window can block the UV light from reaching the wafer, resulting in a continual degradation of the source efficiency. The gas purge created by the slits in the chamber pumping liner can effectively shield the window from the outgassed material, and can carry the material out of the chamber before the material can collect on the window. In order to optimize the removal of such outgassed materials, the gas flow can be maintained relatively close to the surface of the wafer. In one embodiment, the gas flow was kept at less than about 0.150" above the surface of the wafer, although any separation in a range of from about 0.0 to about 1.00 inches would be acceptable in such an application. Other ranges may be utilized as appropriate for the system and/or application. Keeping the flow close to the wafer can help to minimize the gas volume needs to be swept away, and can help to raise the temperature. Also, the velocity increases at a constant pressure with a smaller volume, and the increased momentum of the purge gas helps to remove the outgassed species.

Outgassed porogen also can collect in other areas of the chamber, resulting in particle generation and eventual contamination of the substrate. Since the gas flows between the inlet and outlet channels of the pump liner, the majority of such buildup can occur near the receiving slits of the liner. One way to reduce the amount of buildup on the liner is to raise and maintain the temperature of the liner so that the contaminants are less likely to adhere to, or condense on, the surface of the liner.

Further, a heated liner can be more easily cleaned during a cleaning process. In one example, ozone is used as the cleaning agent for a post-cure clean so that it is not necessary to interrupt the vacuum integrity of the chamber. The ozone can be activated through the build-up or application of heat to dissociate and bond with the organic buildup. In one application, the ozone reacts with carbon based buildup and is subsequently pumped out of the chamber. It then can be desired to maintain the temperature of the liner is in the temperature range needed to activate the ozone reaction as evidenced by ozone etch rate data, such as a temperature range of 120 to 200° C. In one embodiment, the temperature range across a liner varied from about 120° C. to about 75° C. Thermal modeling of a design can be used to assist in selecting the position, shapes, and sizes of the slits, for example, in order to improve the MWBC of the system.

In one embodiment, a liner temperature of at least 120° C. was found to be sufficient for a CIP aluminum liner, in a chamber where the liner otherwise remains between about 60° C. and 70° C. during processing (as measured near the exhaust and pumping port). The efficiency of the ozone clean is drastically increased at these temperatures, such that wet cleaning of the chamber is significantly delayed. In one example, the wet cleaning interval was increased from every 200 wafers to every 2000 wafers. In another example, the residue found on a liner after 100 wafers was substantially eliminated.

In one embodiment the window was heated via application of heat from a heating element. Appropriate heating elements and methods for heating a window or other such element are known in the art and will not be discussed herein in detail. Heating the window can increase the cleaning interval up to after about every 10,000 wafers in one example. The additional cost and complexity to sufficiently heat the window while maintaining optimal processing conditions, however, may not be acceptable for all applications or manufacturers.

In one embodiment, the temperature of the liner is raised via passive heating. The liner can receive heat energy from the cure light source, as well as the gas passing over the wafer being cured. While much of the heat energy will come from convection, the additional heat energy from the UV radiation can help increase the temperature of the liner during processing. In order to further improve the heating of the liner, the physical design of the liner and/or the chamber can be modified.

In a first example, the amount of the liner coming into contact with the chamber body can be minimized. As shown in FIG. 2(b), for example, the lower liner portion 200 can include at least three contact members 216 configured to contact the chamber body and support the liner portions. By utilizing small contact members instead of allowing a large region of the liner to contact the chamber body, the conduction path to the surrounding chamber body is minimized such that the conductive heat loss to the surrounding environment can be significantly reduced. It should be understood that such contact portions could alternatively, or additionally, be placed on the chamber body or between the chamber and the liner. Other contact members can be used between the liner and chamber body as well, such as a metal ring or other such body as would be apparent to one of ordinary skill in the art in light of the teachings contained herein.

In another example, at least a portion of the exterior surface of a chamber pumping liner can be anodized or otherwise coated or treated to drastically increase the emissivity of the external surface, thereby allowing for increased radiation heat transfer from already existing power sources, such as a ceramic heater and/or UV lamp. In one embodiment, an anodized pumping liner has an emissivity in the range of 0.9 versus that of 0.3 for polished aluminum. The increased emissivity of the aluminum allows the liner to capture radiant energy from existing energy sources, such as a ceramic heater or a UV lamp source. While an aluminum liner, for example, might reflect up to 70% of the light radiation from the light source, an anodized liner can absorb approximately 85-90% of the light energy, allowing for a significant increase in heating of the liner due to the light energy. The thickness of the anodized layer can be minimized, to be on the order of about 0.001 to 0.003 inches, for example, to increase the thermal conduction from the external anodized layer to the rest of the aluminum liner. The liner can be anodized using any appropriate anodizing process known or used in the art. In one example, the aluminum is cleaned by etching or use of a solvent, then placed in a solution such as a sulfuric or oxalic acid solution wherein the application of current causes a thick oxide layer (on the order of about 0.002 inches) to form on the liner, which has a consistency and thickness much greater than would be formed without the anodizing process.

In still another example, the dielectric window between the lamp and the substrate support can be expanded in width/diameter so that light from the light source can impinge directly onto at least a portion of the liner. This provides additional heat energy to the liner, without the need for any components not already involved in the process. This wider window can be particularly effective when used with an anodized liner that is able to absorb a majority of the impinging light energy.

In an exemplary system, the diameter of the dielectric window was increased from 13.25 to 14.75 inches, where the process chamber is designed to cure wafers having a diameter of 12.0 inches. This increased the heating of the liner by allowing more IR from UV curing source to reach the pumping liner. The inner diameter of the pumping liner can be selected such that the main gas flow volume is between the window on top, the wafer heater (and thus the wafer) on the bottom, and within the inner diameter of the pumping ring. Other areas of the chamber are effectively dead volumes where materials such as porogen cannot significantly condense before being pumped out.

Figure 5:
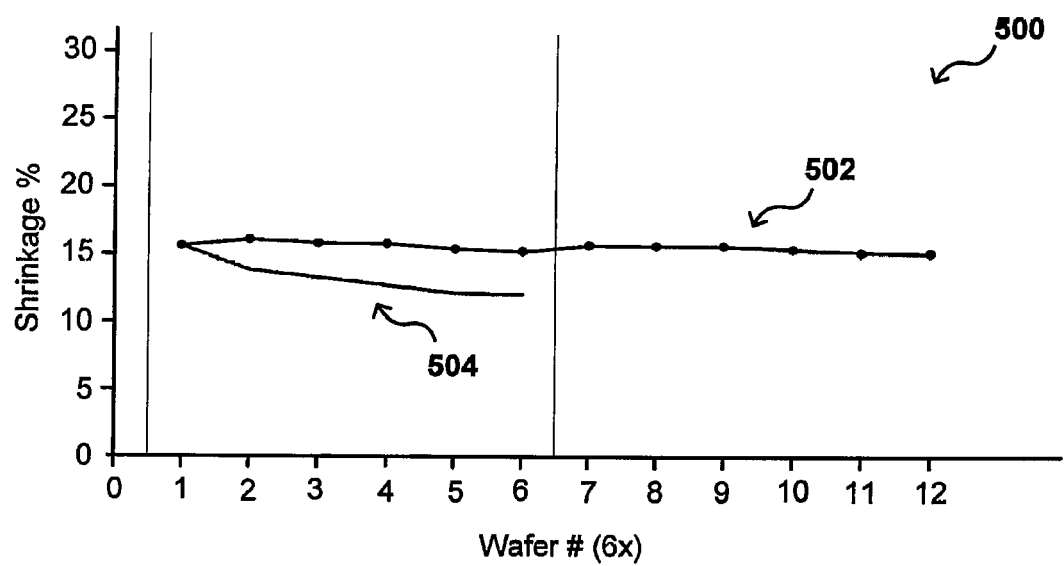
FIG. 5 illustrates a comparison of wafer performance using a purge gas flow in accordance with one embodiment of the present invention.

FIG. 5 shows a plot 500 of data for wafer performance (6×) with 502 and without 504 a laminar purge flow in accordance with one embodiment of the present invention. As can be seen, the process using a laminar flow of gas 502, such as may be introduced using a pump liner as described herein, showed acceptable shrinkage amounts through over 70 wafers. The process without the laminar flow showed a significant variation in shrinkage by about the tenth wafer, and substantial variation by about the 30th wafer.

Figure 6:
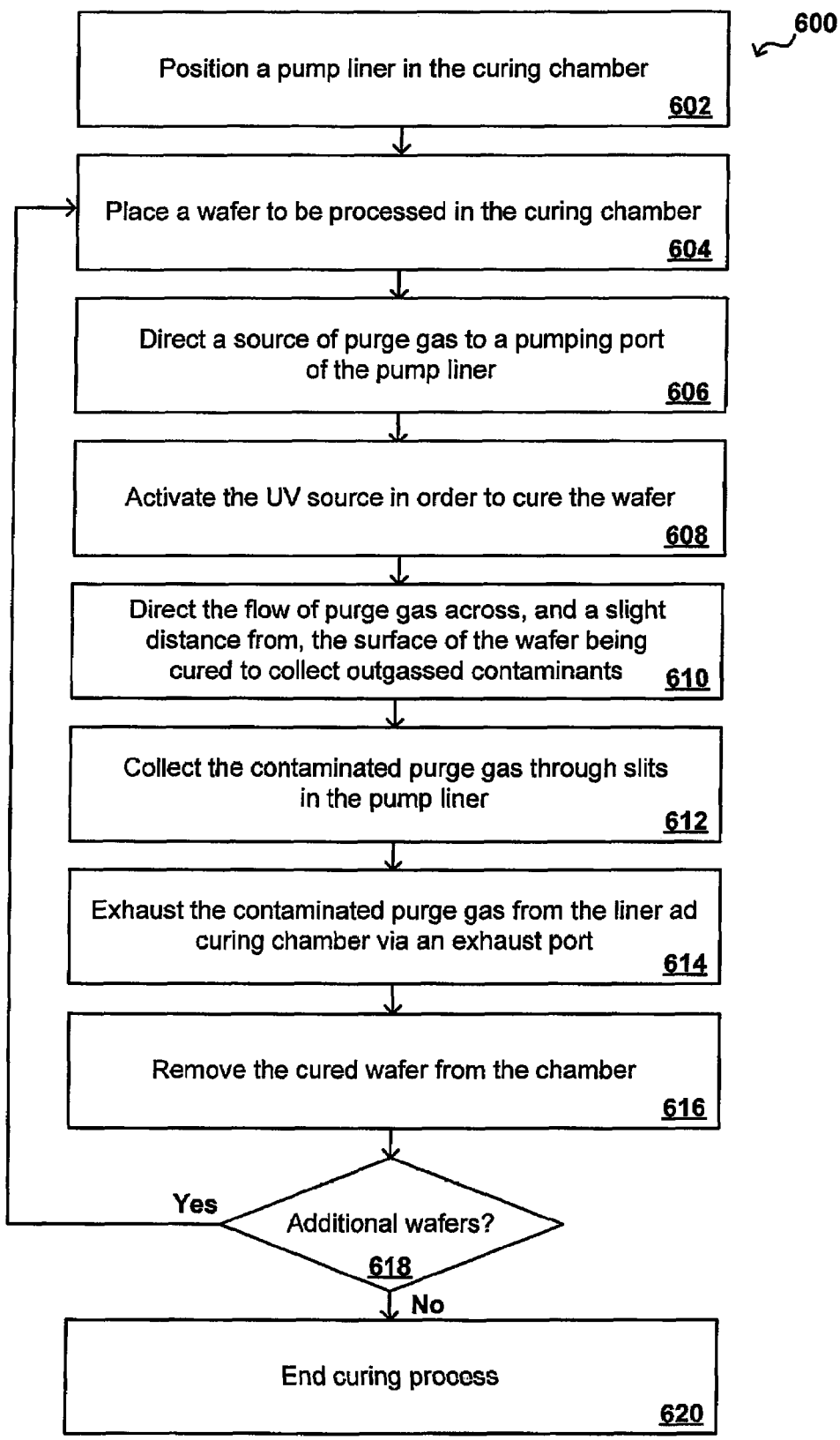
FIG. 6 illustrates steps of a method that can be used in accordance with one embodiment of the present invention.

FIG. 6 illustrates steps of a method 600 for processing a workpiece in accordance with one embodiment of the present invention. This method will be described with respect to a UV curing process, although it should be understood that such a process is merely exemplary and steps similar to those recited in this method can be used with other such processes as would be apparent to one of ordinary skill in the art in light of the teachings and suggestions contained herein. In this method, a pump liner is positioned near a wafer support in a processing chamber 602. The pump liner can have a gas inlet plenum for receiving a source of purge gas, an exhaust plenum for exhausting the purge gas, and at least one pair of slits or other gas ports for directing a flow of purge gas across the surface of a workpiece. The pump liner also can be designed to have minimal contact with the chamber body in order to minimize the flow of heat from the liner. The pump liner also can be anodized or otherwise coated or processed in order to increase the temperature of the liner during processing of a workpiece.

A workpiece to be processed is placed in the chamber 604. In this example, a semiconductor wafer is placed in a UV curing chamber. The pump liner, in this example a ring-shaped liner, is positioned about a periphery of a wafer. A source of purge gas then is directed to a pumping port of the liner in order to direct a flow of purge gas into a channel of the liner 606. The source of purge gas can be selected such that the flow of purge gas across the wafer has sufficient mass and/or momentum to carry away any species or contaminants outgassed from the wafer during curing. The radiation source, such as a UV lamp, can be activated in order to direct radiation onto the wafer for curing 608. The radiation source also can be positioned to direct radiation to at least a portion of the pump liner, in order to further heat the liner during the curing process.

During curing of the wafer, a flow of purge gas can be directed across, and a small distance from, the surface of the wafer being cured 610. The pump liner can be designed such that the flow exits the liner from a series of slits or other injection ports that are positioned, shaped, and sized to provide a substantially even flow across the surface of the wafer with minimal turbulence in the flow. After the purge gas has flowed across the surface of the wafer, and collected any species outgassed from the wafer, the contaminated purge gas can be directed back into the pump liner through a plurality of receiving ports 612. These ports, or slits, can again be designed to allow for a substantially even flow across the wafer surface, and to provide for a minimal amount of turbulence near the receiving slits of the liner. The contaminated flow of purge gas can be exhausted from the liner via at least one exhaust plenum, and directed out of the system 614. The wafer then is removed from the system at the end of the curing process 616. If there are additional wafers to process 618, then another wafer is placed in the chamber. If not, then the process can end 620. In one embodiment, the contaminated gas is collected from the exhaust port of the liner and passed through at least one particulate filter than can remove substantially all of the outgassed species in the contaminate flow of purge gas. This filtered flow then can be directed back through the pump liner and across the wafer, reducing the amount of source gas used and reducing the exhaust requirements for the facility. The recirculation of gas can reduce operating costs, but can reduce MWBC in some embodiments as there can be some level of contaminants in the re-circulated purge gas that can collect on the pump liner.

Although passive heating of the pumping liner can be an effective an relatively cost effective approach, there still is some time required near startup of the processing chamber before the liner reaches the desired temperature. As shown in FIG. 5, even processing of a few wafers can significantly impact performance. As such, certain embodiments incorporate a heater, either in the pumping liner or in thermal connection with the liner (e.g., on the liner), in order to pre-heat the liner to the desired temperature before the first wafer is processed, in order to further prevent the condensation of materials such as porogen on the liner.

After reading the above description, other recipes that use center-fast deposition will occur to those of ordinary skill in the art. Other variations will also be apparent without departing from the spirit of the invention. These equivalents and alternatives are intended to be included within the scope of the present invention. Therefore, the scope of this invention should not be limited to the embodiments described, but should instead be defined by the following claims.

What is claimed is:

1. A system for curing a workpiece, comprising:
a chamber housing;
a substrate support in the chamber housing for supporting a workpiece;
a radiation source operable to direct radiation onto a workpiece supported on the substrate support in order to cure the workpiece; and
a pump liner including a ring-shaped element having a central opening shaped to fit around a periphery of the workpiece, the ring-shaped element having a gas inlet plenum and a gas outlet plenum for receiving a flow of purge gas into a first channel in the ring-shaped element and exhausting the flow of purge gas from a second channel in the ring-shaped element, the pump liner having a plurality of injection slits positioned near the central opening and operable to direct a substantially laminar flow of purge gas across a surface of the workpiece being cured by the radiation, the pump liner further having a plurality of receiving slits positioned near the central opening and opposite the plurality of injection slits operable to receive the flow of gas directed across the wafer, the receiving slits being further operable to receive any species outgassed from the workpiece during the curing process.

2. A system according to claim 1, further comprising:
a source of purge gas operable to direct the flow of purge gas to the pump liner.

3. A system according to claim 1, wherein:
the flow of purge gas has a mass and momentum sufficient to carry away a species outgassed from the workpiece during curing.

4. A system for curing a workpiece, comprising:
a chamber housing;
a substrate support in the chamber housing for supporting a workpiece;
a radiation source operable to direct radiation onto a workpiece supported on the substrate support in order to cure the workpiece; and
a pump liner having a gas inlet plenum and a gas outlet plenum for receiving and exhausting a flow of purge gas, the pump liner having a plurality of injection slits operable to direct a substantially laminar flow of purge gas across a surface of the workpiece being cured by the radiation, the pump liner further having a plurality of receiving slits opposite the plurality of injection slits operable to receive the flow of gas directed across the wafer, the receiving slits being further operable to receive any species outgassed from the workpiece during the curing process, the pump liner having a plurality of contact members for contacting the chamber housing, the contact members minimizing a contact area between the pump liner and the chamber housing in order to reduce the ability for heat flow from the pump liner to the chamber housing.

5. A system according to claim 1, wherein the pump liner is an aluminum pump liner.

6. A system according to claim 1, wherein at least a portion of an exposed surface of the pump liner is anodized.

7. A system according to claim 1, wherein:
the radiation source is further operable to direct radiation to at least a portion of the pump liner, whereby a temperature of the pump liner is increased.

8. A system according to claim 1, further comprising:
a window positioned between the radiation source and the workpiece support, the window having a diameter sufficient such that the radiation source can direct radiation to an entire workpiece surface to be cured and at least a portion of the pump liner,
wherein the flow of purge gas substantially minimizes the collection of outgassed species on the window.

9. A system according to claim 1, further comprising:
a heating element in thermal contact with the pump liner, the heating element operable to bring the pump liner to a pre-determined temperature before the flow of purge gas is directed across the surface of the workpiece.

10. A system according to claim 1, wherein:
the radiation source includes at least one ultraviolet (UV) lamp.

11. A pump liner for directing a flow of purge gas across a workpiece in a processing chamber, comprising:
a ring-shaped element having a central opening adapted to fit around a periphery of a workpiece, the ring-shaped element having an inlet plenum operable to receive a flow of purge gas into a first channel in the ring-shaped element and an exhaust plenum operable to direct the flow of purge gas out of a second channel in the ring-shaped element;

a plurality of injection ports positioned near the central opening of the ring-shaped element and operable to direct the flow of purge gas, received by the inlet plenum, from the first channel and across a surface of the workpiece, the injection ports operable to direct a substantially laminar flow of the purge gas across the surface; and a plurality of receiving ports positioned near the central opening of the ring-shaped element, the receiving ports being substantially opposite the plurality of injection ports, and operable to receive the flow of purge gas directed across the surface of the workpiece, as well as any species outgassed by the workpiece carried by the flow, and direct the flow and outgassed species through the second channel and out of the ring-shaped element through the exhaust plenum.

12. A pump liner according to claim 11, wherein:
the pump liner is formed of aluminum.

13. A pump liner according to claim 11, wherein:
at least a portion of an exposed surface of the pump liner is anodized.

14. A pump liner according to claim 11, wherein:
each of the plurality of injection ports and plurality of receiving ports includes a plurality of slits in the ring-shaped element.

15. A pump liner according to claim 11, wherein:
the ring-shaped element further has a plurality of contact members for contacting a chamber housing, the contact members minimizing a contact area between the ring-shaped element and the chamber housing in order to reduce the ability for heat flow from the ring-shaped element to the chamber housing.

16. A pump liner according to claim 11, wherein:
the ring-shaped element includes first and second mating portions.

17. A pump liner according to claim 11, wherein:
each of the plurality of injection ports and plurality of receiving ports is at least one of shaped, sized, and positioned to provide for the substantially laminar flow.

18. A pump liner according to claim 11, wherein:
the plurality of injection ports includes a plurality of injection ports of at least one of different shapes and different sizes.

19. A method for curing a workpiece, comprising:
positioning a workpiece to be cured on a workpiece support in a processing chamber;
directing radiation toward a surface of the workpiece on the workpiece support, the radiation selected to cure at least a layer of material on the surface;
providing a flow of purge gas across the irradiated surface of the workpiece, the flow of purge gas emanating from a pump liner including a ring-shaped element having a central opening shaped to fit around a periphery of the workpiece and having a plurality of injection slits and a plurality of receiving slits positioned near the central opening of the ring-shaped element for directing a substantially laminar flow of purge gas across the irradiated surface of the workpiece, the ring-shaped element having an inlet plenum for receiving the flow of purge gas into a first channel in the ring-shaped element, the flow of purge gas sufficient to transport any species outgassed from the irradiated surface of the workpiece; and
exhausting the flow of purge gas and the outgassed species after the flow passes across the irradiated surface and is received by the receiving slits of the pump liner, the ring-shaped element of the pump liner having an exhaust plenum operable to direct the flow of purge gas out of a second channel in the ring-shaped element.

20. A method according to claim 19, further comprising:
selecting at least one of a shape, size, position, and number of at least one of the plurality of injection slits and a plurality of receiving slits in order to provide for the substantially laminar flow.

21. A method according to claim 19, further comprising:
directing a portion of the radiation toward a portion of the pump liner in order to increase an operating temperature of the pump liner.

22. A method for curing a workpiece, comprising:
positioning a workpiece to be cured on a workpiece support in a processing chamber;
directing radiation toward a surface of the workpiece on the workpiece support, the radiation selected to cure at least a layer of material on the surface;
providing a flow of purge gas across the irradiated surface of the workpiece, the flow of purge gas emanating from a pump liner having a plurality of injection slits and a plurality of receiving slits for directing a substantially laminar flow of purge gas across the irradiated surface of the workpiece, the flow of purge gas sufficient to transport any species outgassed from the irradiated surface of the workpiece;
exhausting the flow of purge gas and the outgassed species after the flow passes across the irradiated surface and is received by the receiving slits of the pump liner; and
minimizing a contact area between the pump liner and a body of the processing chamber in order to minimize an amount of heat flow from the pump liner to the body.

23. A method according to claim 19, further comprising:
anodizing the pump liner in order to increase an emissivity of the pump liner.

24. A method according to claim 19, wherein:
providing a flow of purge gas includes providing a flow of argon gas.

25. A method according to claim 19, wherein:
providing a flow of purge gas includes providing a flow of purge gas at a distance of less than 0.150" above the irradiated surface.

* * * * *